United States Patent
Bristol et al.

(10) Patent No.: US 10,269,623 B2
(45) Date of Patent: Apr. 23, 2019

(54) IMAGE TONE-REVERSAL WITH A DIELECTRIC USING BOTTOM-UP CROSS-LINKING FOR BACK END OF LINE (BEOL) INTERCONNECTS

(71) Applicant: Intel Corporation, Santa Clara, CA (US)

(72) Inventors: Robert L. Bristol, Portland, OR (US); James M. Blackwell, Portland, OR (US); Rami Hourani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/573,457

(22) PCT Filed: Jun. 22, 2015

(86) PCT No.: PCT/US2015/036984
§ 371 (c)(1),
(2) Date: Nov. 10, 2017

(87) PCT Pub. No.: WO2016/209205
PCT Pub. Date: Dec. 29, 2016

(65) Prior Publication Data
US 2018/0122690 A1    May 3, 2018

(51) Int. Cl.
*H01L 21/768* (2006.01)
*H01L 21/02* (2006.01)
*H01L 21/033* (2006.01)

(52) U.S. Cl.
CPC .. *H01L 21/76816* (2013.01); *H01L 21/02126* (2013.01); *H01L 21/02211* (2013.01);
(Continued)

(58) Field of Classification Search
CPC .......... H01L 21/76816; H01L 21/0335; H01L 21/76808; H01L 21/76801;
(Continued)

(56) References Cited

U.S. PATENT DOCUMENTS 8,822,137 B2 *  9/2014  Lin ..................... H01L 23/5222
                                                        430/311
9,023,222 B2    5/2015  Kawanishi et al.
(Continued)

FOREIGN PATENT DOCUMENTS

EP      2579304 A1      4/2013
JP      2014-192336     10/2014
(Continued)

OTHER PUBLICATIONS

International Search Report and Written Opinion for International Patent Application No. PCT/US2015/036984 dated Mar. 21, 2016, 12 pgs.
(Continued)

*Primary Examiner* — Selim U Ahmed
(74) *Attorney, Agent, or Firm* — Schwabe, Williamson & Wyatt, P.C.

(57) ABSTRACT

Image tone-reversal with a dielectric using bottom-up cross-linking for back end of line (BEOL) interconnects is described. In an example, a semiconductor structure including a metallization layer includes a plurality of trenches in an interlayer dielectric (ILD) layer above a substrate. A pre-catalyst layer is on sidewalls of one or more, but not all, of the plurality of trenches. Cross-linked portions of a dielectric material are proximate the pre-catalyst layer, in the one or more of the plurality of trenches. Conductive structures are in remaining ones of the trenches.

5 Claims, 12 Drawing Sheets

(52) U.S. Cl.
CPC .. *H01L 21/02282* (2013.01); *H01L 21/02304* (2013.01); *H01L 21/0335* (2013.01); *H01L 21/76801* (2013.01); *H01L 21/76808* (2013.01); *H01L 21/76897* (2013.01); *H01L 2224/16225* (2013.01)

(58) Field of Classification Search
CPC ......... H01L 21/02304; H01L 21/02282; H01L 21/02211; H01L 21/02126; H01L 21/76897; H01L 2224/16225
See application file for complete search history.

(56) References Cited

U.S. PATENT DOCUMENTS

| | | |
|---|---|---|
| 9,041,217 B1 | 5/2015 | Bristol et al. |
| 2004/0137241 A1 | 7/2004 | Lin et al. |
| 2012/0189782 A1 | 7/2012 | Zafiropoulos et al. |
| 2012/0313251 A1 | 12/2012 | Kato |
| 2014/0342290 A1 | 11/2014 | Wu et al. |
| 2015/0093702 A1* | 4/2015 | Nyhus .................. G03F 7/0392 430/270.1 |
| 2015/0171010 A1 | 6/2015 | Bristol |

FOREIGN PATENT DOCUMENTS

| | | |
|---|---|---|
| KR | 10-2014-0074427 | 6/2014 |
| WO | WO 2016/106421 A1 | 6/2016 |

OTHER PUBLICATIONS

International Preliminary Report on Patentability for International Patent Application No. PCT/US2015/036954, dated Jan. 4, 2018, 9 pages.

Search Report for European Patent Application No. 15896499.9, dated Jan. 23, 2019, 9 pages.

* cited by examiner

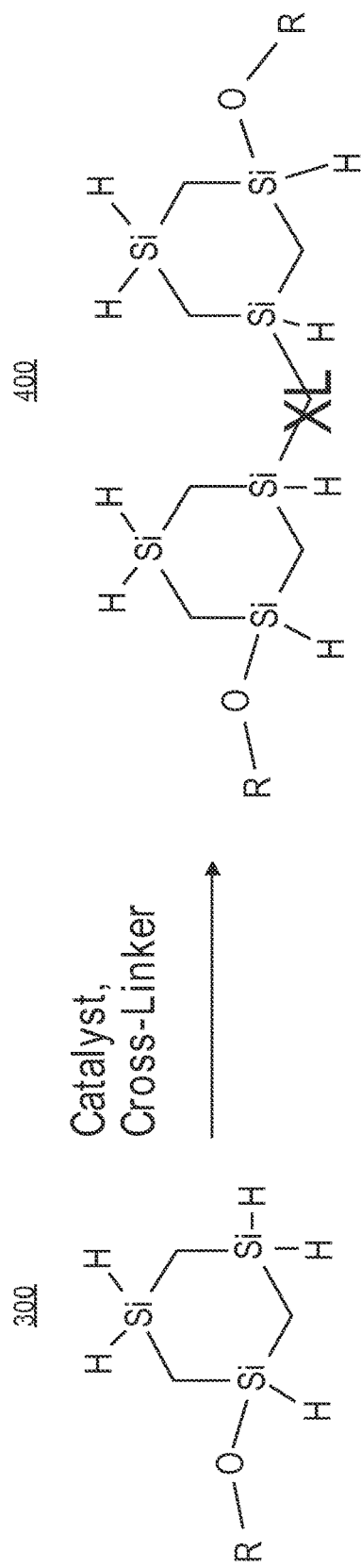

IMAGE TONE-REVERSAL WITH A DIELECTRIC USING BOTTOM-UP CROSS-LINKING FOR BACK END OF LINE (BEOL) INTERCONNECTS

CROSS-REFERENCE TO RELATED APPLICATION

This patent application is a U.S. National Phase Application under 35 U.S.C. § 371 of International Application No. PCT/US2015/036984, filed Jun. 22, 2015, entitled "IMAGE TONE-REVERSAL WITH A DIELECTRIC USING BOTTOM-UP CROSS-LINKING FOR BACK END OF LINE (BEOL) INTERCONNECTS," which designates the United States of America, the entire disclosure of which is hereby incorporated by reference in its entirety and for all purposes.

TECHNICAL FIELD

Embodiments of the invention are in the field of semiconductor structures and processing and, in particular, image tone-reversal with a dielectric using bottom-up cross-linking for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less.

One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Improvements are needed in the area of back end metallization manufacturing technologies for fabricating metal lines, metal vias, and dielectric plugs.

BRIEF DESCRIPTION OF THE DRAWINGS

FIG. 2A illustrates a cross-sectional view of a starting structure following of a starting structure following pre-patterning of trenches in an ILD material;

FIG. 2B illustrates a cross-sectional view of the structure of FIG. 2A following treatment of the empty trenches or holes with a pre-catalyst layer;

FIG. 2C illustrates a cross-sectional view of the structure of FIG. 2B following filling of the resulting decorated holes with a dielectric material;

FIG. 2D illustrates a cross-sectional view of the structure of FIG. 2C following cross-linking of the portions of the dielectric material;

FIG. 2E illustrates a cross-sectional view of the structure of FIG. 2D following removal of the overburden regions of the dielectric material;

FIG. 2F illustrates a cross-sectional view of the structure of FIG. 2E following removal of the resist selective to the cross-linked regions;

FIG. 2G illustrates a cross-sectional view of the structure of FIG. 2F following formation of a metal fill layer; and FIG. 2H illustrates a cross-sectional view of the structure of FIG. 2G following planarization of the metal fill layer.

FIG. 3 illustrates a trisilacyclohexane molecule, in accordance with an embodiment of the present invention.

FIG. 4 illustrates two cross-linked (XL) trisilacyclohexane molecules to form a cross-linked material, in accordance with an embodiment of the present invention.

FIG. 6A illustrates a starting point structure for a subtractive via and plug process following deep metal line fabrication;

FIG. 6B illustrates the structure of FIG. 6A following recessing of the metal lines;

FIG. 6C illustrates the structure of FIG. 6B following formation of an interlayer dielectric (ILD) layer;

FIG. 6D illustrates the structure of FIG. 6C following deposition and patterning of a hardmask layer;

FIG. 6E illustrates the structure of FIG. 6D following trench formation defined using the pattern of the hardmask of FIG. 6D;

FIG. 6F illustrates the structure of FIG. 6E following resist and dielectric material formation;

FIG. 6G illustrates the structure of FIG. 6F following cross-linking of the dielectric material to form cross-linked portion;

FIG. 6H illustrates the structure of FIG. 6G following formation of tone-reversed permanent ILD material; and FIG. 6I illustrates the structure of FIG. 6H following metal line and via formation.

DESCRIPTION OF THE EMBODIMENTS

Figure 1:
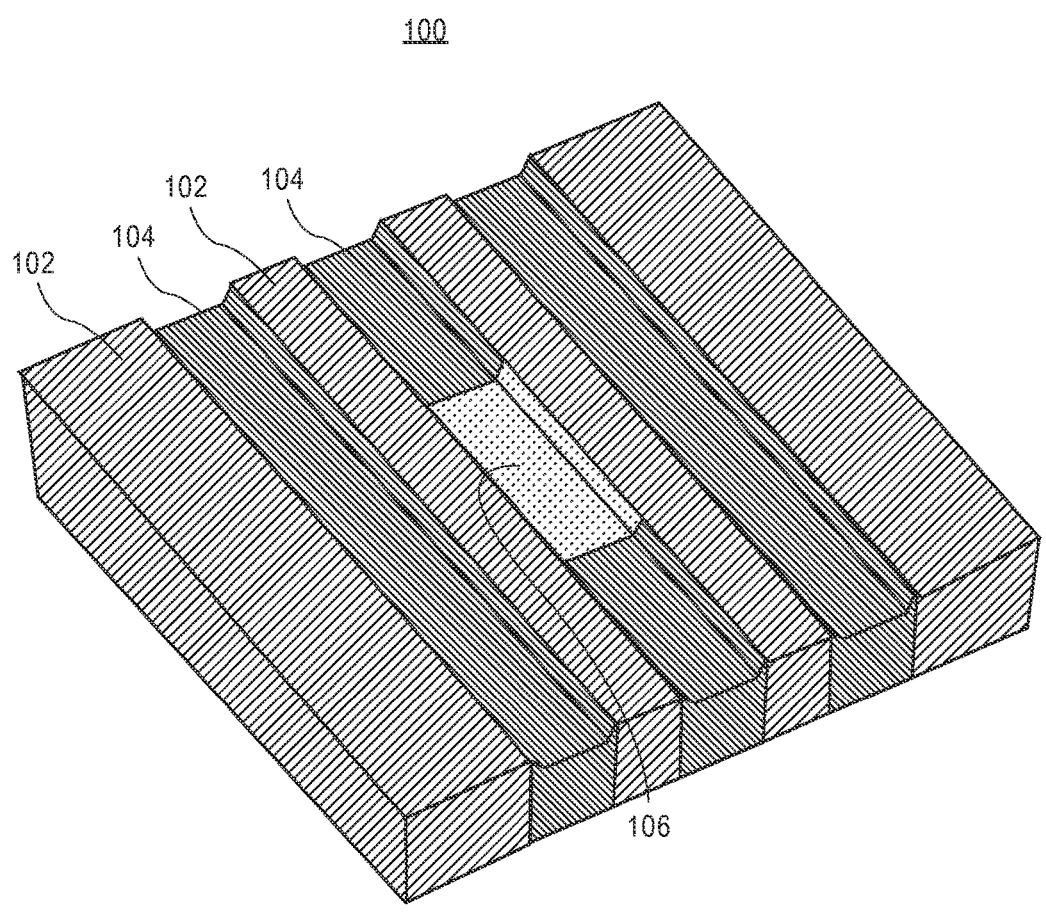
FIG. 1 illustrates an angled view of an alternating pattern of inter-layer dielectric (ILD) lines and resist lines, with a hole formed in one of the resist lines, in accordance with an embodiment of the present invention.

Image tone-reversal with a dielectric using bottom-up cross-linking for back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to a class of materials with special properties to enable pattern reversal (e.g., holes reversed to posts), and related processing approaches and the structures resulting there from. The class of materials may be a class of soft materials, e.g., photoresist-like materials. As a general approach, a resist-like material is deposited in a pre-patterned hardmask. The resist-like material may then be selected out with a high-resolution lithography tool, e.g., an extreme ultraviolet (EUV) processing tool. On the other hand, resist-like material may instead be left to remain permanently in a finally fabricated structure, e.g., as an inter-layer dielectric (ILD) material or structure ("plugs") that form breaks between metal lines. Overlay (edge placement) problems anticipated for next generation plug patterning may be addressed by one or more approaches described herein.

More specifically, one or more embodiments described herein are directed to use of a spin-on dielectric (e.g., ILD) with particular properties that enable the filling of holes ("buckets") in a patterned photoresist layer without destroying the photoresist layer pattern. First, the spin-on dielectric material is introduced in a solvent which does not dissolve or cause intermixing of the photoresist and the dielectric material. It is to be appreciated that good fillability of holes is required. Initial cross-linking (or setting) of the spin-on dielectric film is accomplished under conditions where the photoresist and spin-on dielectric do not intermix and lose pattern information. Once the pattern is reversed, the material within the bucket is then converted through baking/curing to a dielectric with desired properties such as k-value, modulus, etch selectivity etc. Although not limited to such material, a spin-on dielectric material based on a 1,3,5-trisilacyclohexane building block may be implemented to satisfy the above criteria. Cross-linking with loss of solubility of such a material (or other silicon based dielectrics) can be initiated either thermally, or at lower temperatures, by use of acid, base or Lewis acid catalyst processes. In one embodiment, such low temperature catalysis is critical for the implementation of approaches described herein.

In an embodiment, approaches described herein involves taking a best imaging performance (e.g., which comes from positive tone materials) in order to produce a negative-tone pattern, where the final film possesses sought after material properties. The final material properties may be akin to those of a high performance low-k dielectric/ILD material). By contrast, state-of the art options for direct patterning of dielectric films are limited and not expected to exhibit the necessary lithographic performance to be manufacturable for future scaled down technology generations.

As described in greater detail below in association with FIGS. 1 and 2A-2H, in accordance with embodiments described herein, trenches pre-patterned in an ILD material are filled with chemically amplified photoresist. Using high resolution lithography (e.g., EUV), selected holes within the trenches are exposed and removed via conventional positive tone processing. At this stage, the empty holes are treated with a pre-catalyst layer. In one such embodiment, the pre-catalyst layer is a self-assembled monolayer (SAM)-containing attached catalyst layer. The resulting decorated holes are then filled with dielectric precursor, with accompanying overburden. The localization (or close proximity) of the catalyst in the holes leads to selective cross-linking and setting of the dielectric in the holes only. Overburden and photoresist are removed followed by final curing of dielectric (if needed) and metallization processes.

In accordance with an embodiment of the present invention, a key feature of approaches described herein involves the accommodation of varying pattern density with varying thickness of overburden. In one embodiment, such accommodation is enabled since cross-linking only occurs in/near the hole and an overburden ultimately removed by planarization (e.g., by chemical mechanical polishing). In an embodiment, selective cross-linking of a dielectric material in a hole is effected without effecting the same in regions of overburden. In a particular embodiment, following positive tone lithographic patterning and development, a hydrophilic Si—OH terminated surface is exposed in the holes and anywhere photoresist has been removed. The hydrophilic surface may be present prior to photoresist coating or created during, e.g., tetramethylammonium hydroxide (TMAH) development or subsequent rinses. It is to be appreciated that photoresist that has not been exposed and developed will maintain characteristic mildly or strongly hydrophobic nature and, thus, the patterning process effectively creates hydrophilic and hydrophobic domains.

In an embodiment, the exposed hydrophilic surface is functionalized with a surface grafting agent which carries either catalyst or pre-catalyst needed to cross-link a dielectric material. Subsequent coating of dielectric leads to the filling of holes with overburden, as described above, and as illustrated in greater detail below. Upon activation and controlled diffusion of pre-catalyst with, e.g., a low temperature bake, the dielectric material is selectively cross-linked in the hole with minimal cross-linking occurring in the overburden, i.e., directly above the hole. The overburden dielectric material can then be removed using casting solvent or dissolution in another solvent. It is to be appreciated that the removal process may also remove photoresist, or photoresist can be removed with another solvent or by an ashing process. In an embodiment, with the tone reversed, the dielectric material may be baked/cured at a relatively higher temperature prior to metallization or other processing.

In accordance with one or more embodiments described herein, there are several approaches for installing catalyst or pre-catalyst in a hole. For some dielectric materials, strong Bronsted acids are required. In other cases, strong Lewis acids may be employed. For ease of description herein, the term "acid" is used to refer to both scenarios. In an embodiment, direct adsorption of catalyst or pre-catalyst is employed. In this scenario, the catalyst is coated onto a hydrophilic surface and held strongly via H-bonding or other electrostatic interaction. Subsequent coating of a dielectric material leads to acid and dielectric precursor localized in the hole, where thermal or other activation initiates desired cross-linking chemistry. In an exemplary embodiment, the reaction of an Si—OH rich surface with the strong Lewis acid $B(C_6F_5)_3$ leading to formation of Si—O—$B(C_6F_5)_3H^+$. This resulting Lewis acid is used to catalyze cross-linking of hydrosilane precursor molecules at relatively lower temperature than non-catalyzed processes. In one embodiment, the large size of the catalyst employed minimizes diffusion into the overburden regions.

In another embodiment, approaches involve covalent adhesion of a catalyst or pre-catalyst via silane chemistries such as chloro-, alkoxy-, and amino silanes or other surface grafting groups that may include siloxanes, silyl chlorides, alkenes, alkynes, amines, phosphines, thiols, phosphonic acids or carboxylic acids. In this scenario, a catalyst or precatalyst is covalently linked to a grafting agent. For example, well-known acid generators (e.g., photo- or thermal) based on onium salts can be attached to siloxanes (e.g. $[(MeO)_3Si—CH_2CH_2CH_2SR_2][X]$ where R=alkyl or aryl groups and X=weakly coordinating anions such as triflate, nonaflate, H—$B(C_6F_5)_3$, $BF_4$ etc). The catalyst or pre-catalyst can be either selectively attached to the ILD of interest, or selectively removed from the resist using thermal, dry etch, or wet etch processes. In yet another embodiment, the catalyst or pre-catalyst is introduced prior to photoresist coating using similar techniques. In this scenario, to be effective, the grafted material must not interfere with lithography and must survive subsequent processing.

As an exemplary vehicle for demonstrating the concepts described herein, FIG. 1 illustrates an angled view of an alternating pattern of inter-layer dielectric (ILD) lines and resist lines, with a hole formed in one of the resist lines, in accordance with an embodiment of the present invention. Referring to FIG. 1, a pattern 100 includes alternating ILD lines 102 and resist lines 104. A hole 106 is formed in one of the resist lines 104, e.g., by conventional lithography. As described below, in association with FIGS. 2A-2H, a pattern such as the pattern 100 can be subjected to tone reversal.

In an exemplary process flow, FIGS. 2A-2H illustrate cross-sectional views in a fabrication process involving image tone-reversal with a dielectric using bottom-up cross-linking, in accordance with an embodiment of the present invention.

Figure 2A:
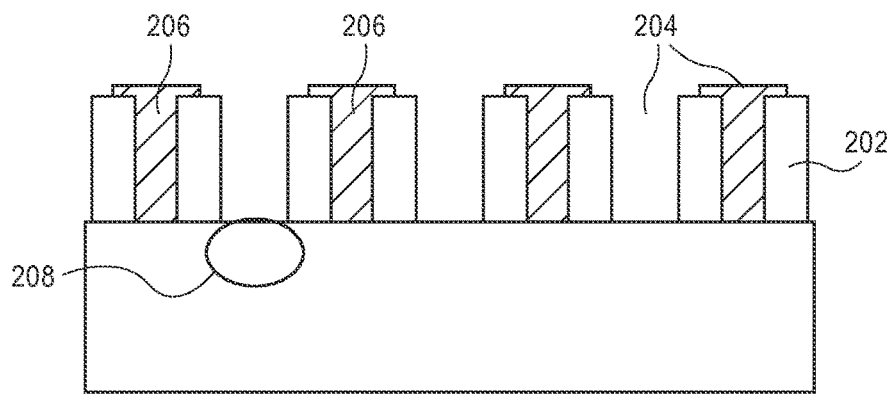
FIGS. 2A-2H illustrate cross-sectional views in a fabrication process involving image tone-reversal with a dielectric using bottom-up cross-linking, in accordance with an embodiment of the present invention, where.

FIG. 2A illustrates a cross-sectional view of a starting structure following pre-patterning of trenches 204 in an ILD material 202. Select ones of the trenches 204 are filled with a chemically amplified photoresist 206, while others have been processed to provide unfilled trenches (or unfilled trench portions, as shown in FIG. 1). For example, in one embodiment, using high resolution lithography (e.g., extreme ultra-violet (EUV) lithography), selected holes within the trenches 204 are exposed and removed via conventional positive tone processing.

Although not depicted for simplicity, it is to be appreciated that the unfilled trenches (or holes formed within filled trenches) may expose underlying features, such as underlying metal lines, in region 208. Furthermore, in an embodiment, the starting structure may be patterned in a grating-like pattern with trenches spaced at a constant pitch and having a constant width. The pattern, for example, may be fabricated by a pitch halving or pitch quartering approach. Some of the trenches may be associated with underlying vias or lower level metallization lines. For example, it is to be understood that the layers and materials described in association with FIG. 2A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted in FIG. 2A may be fabricated on underlying lower level interconnect layers.

Referring generally to embodiments described herein, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts (e.g., those materials with a dielectric constant less than that of silicon dioxide), and combinations thereof. The interlayer dielectric material may be formed by conventional techniques, such as, for example, chemical vapor deposition (CVD), physical vapor deposition (PVD), or by other deposition methods. The interconnect lines (metal lines and vias structures) formed in the ILD material are also sometimes referred to in the art as traces, wires, lines, metal, or simply interconnect.

Figure 2B:
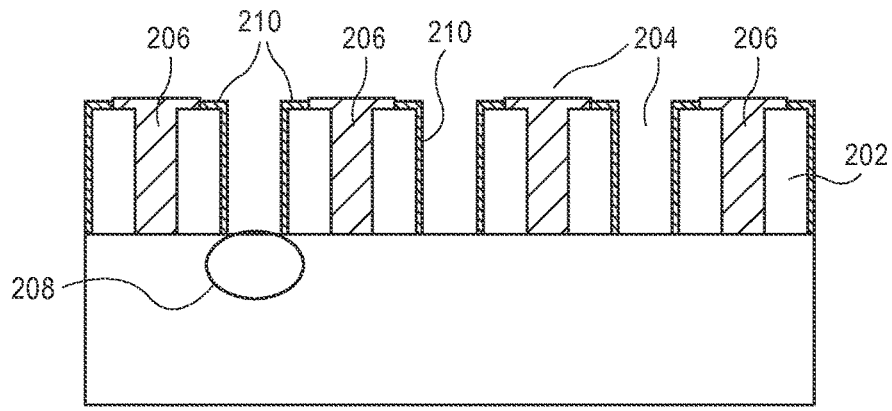

FIG. 2B illustrates a cross-sectional view of the structure of FIG. 2A following treatment of the empty trenches or holes with a pre-catalyst layer 210 which, in one embodiment, is a self-assembled monolayer (SAM)-containing catalyst material. In one such embodiment, as depicted, the pre-catalyst layer 210 is formed on exposed portions of the ILD 202, but not on exposed portions of the resist 206 or any exposed metal such as at regions 208. In an embodiment, the pre-catalyst layer 210 is formed by exposing the structure of FIG. 2A to pre-catalyst-forming molecules in the vapor phase, or molecules dissolved in solvent. In one embodiment, the pre-catalyst layer is a layer of catalyst or pre-catalyst formed by direct adsorption, as described above. In another embodiment, the pre-catalyst layer 210 is a layer of catalyst or pre-catalyst formed by covalent adhesion.

Figure 2C:
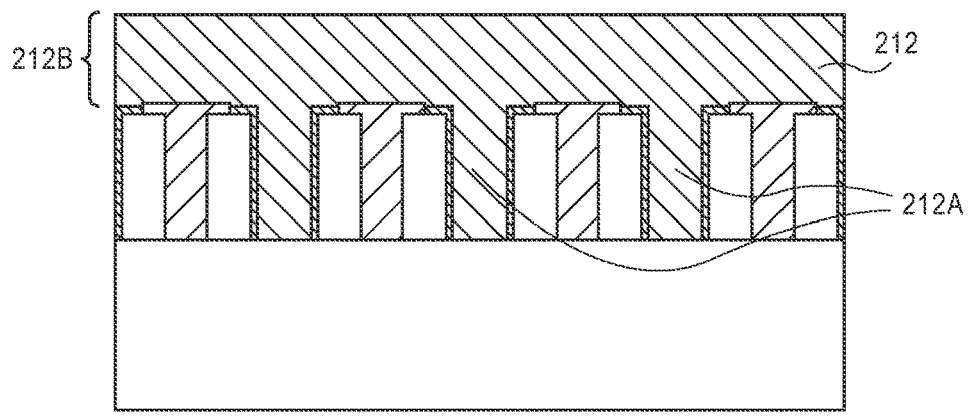

FIG. 2C illustrates a cross-sectional view of the structure of FIG. 2B following filling of the resulting decorated holes with a dielectric material 212. It is to be appreciated that the dielectric material 212 has a portion 212A filling the trenches or holed and a portion 212B above the trenches or holes. The portions 212B is referred to herein as overburden. In one embodiment, the dielectric material 212 is a spin-on dielectric material.

In an embodiment, the dielectric material 212 is selected from a class of materials based on hydrosilane precursor molecules, where catalyst mediates reaction of Si—H bonds with cross-linkers such as water, tetraethoxyorthosilicate (TEOS), hexaethoxytrisilacyclohexane or similar multifunctional cross-linkers. In one such embodiment, the dielectric material 212 includes trisilacyclohexanes which may subsequently be linked together by O groups. In other embodiments, alkoxy silane based dielectric precursors or silsesquioxane (SSQ) are used for the dielectric material 212.

Figure 2D:
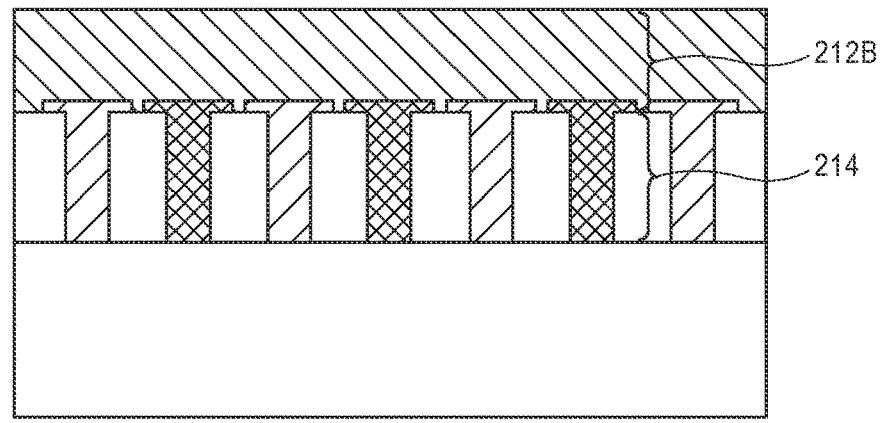

FIG. 2D illustrates a cross-sectional view of the structure of FIG. 2C following cross-linking of the portions 212A of the dielectric material 212. In an embodiment, the localization (or close proximity) of the catalyst (e.g., pre-catalyst layer 210) in the unfilled trenches or holes leads to selective cross-linking to form cross-linked regions 214 and setting of the portions 212A of the dielectric material 212 in the holes only. That is, in an embodiment, the portions 212B of the dielectric material 212 are not cross-linked. In an embodiment, the cross-linking used to form regions 214 is effected by a thermal curing process, i.e., by heating.

Figure 5:
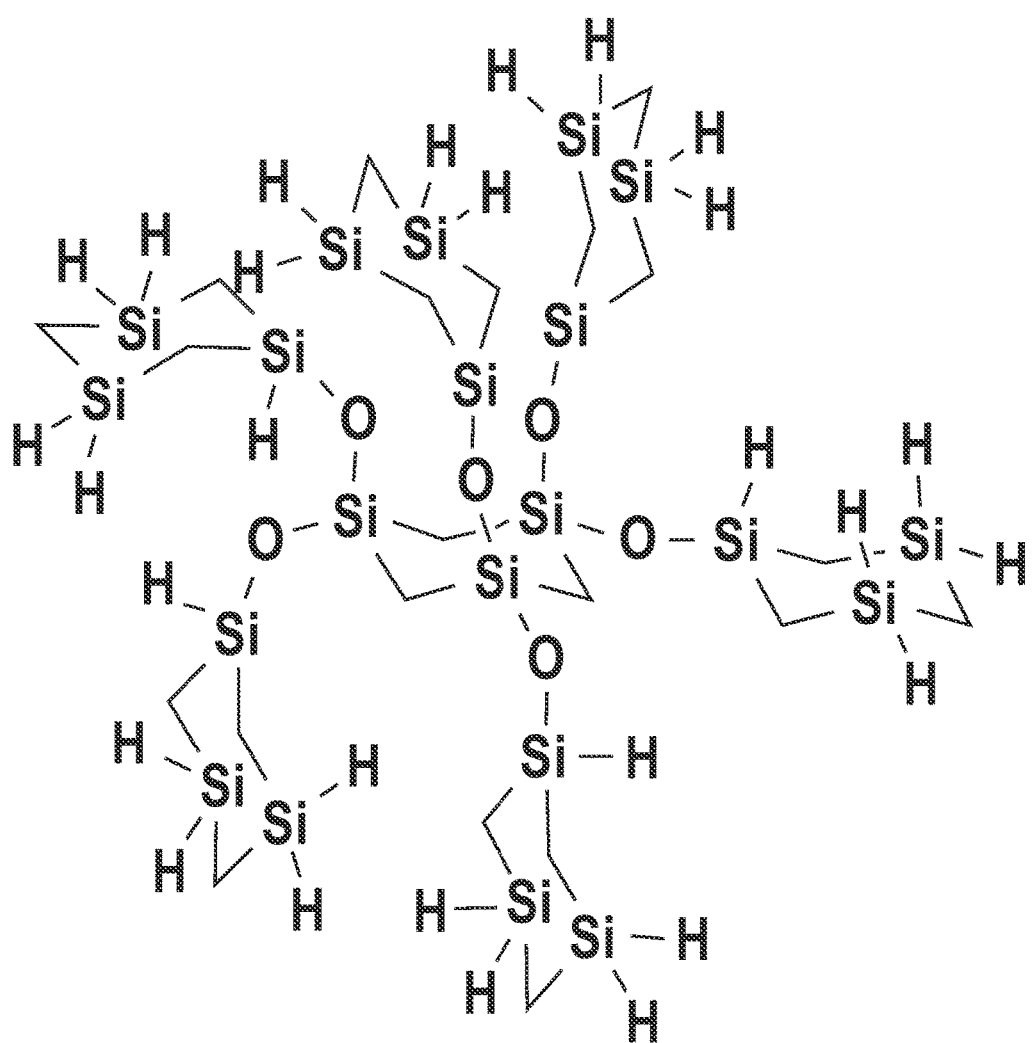
FIG. 5 illustrates an idealized representation of a linked trisilacyclohexane structure, in accordance with an embodiment of the present invention.

In an embodiment, the dielectric material 212 includes trisilacyclohexanes and the cross-linking used to form regions 214 includes linking trisilacyclohexanes together by O groups. Referring to FIG. 3 illustrates a trisilacyclohexane 300. Referring to FIG. 4, two cross-linked (XL) trisilacyclohexane molecules 300 form a cross-linked material 400. FIG. 5 illustrates an idealized representation of a linked trisilacyclohexane structure 500. It is to be appreciated that, in reality, structure 500 is used to represent a complex mix of oligomers, but the common point is the H-capped trisilacyclohexane rings.

Figure 2E:
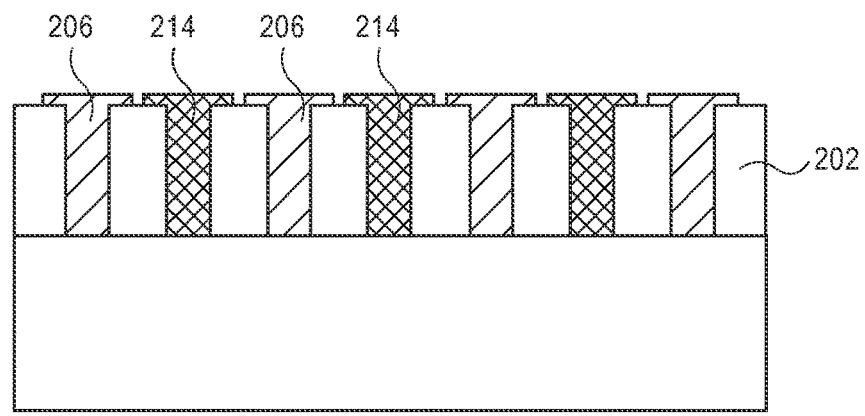
Figure 2F:
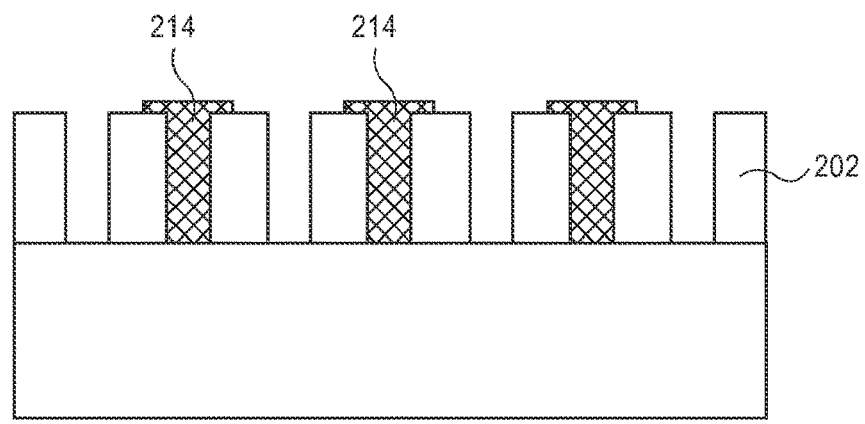

FIG. 2E illustrates a cross-sectional view of the structure of FIG. 2D following removal of the overburden regions 212B of the dielectric material 212. FIG. 2F illustrates a cross-sectional view of the structure of FIG. 2E following removal of the resist 206 selective to the cross-linked regions 214. In an embodiment, as is depicted, the resist 206 is removed in a subsequent and different processing operation (such as a second wet chemical development operation) from the processing operation used to remove the overburden regions 212B of the dielectric material 212 (such as a first wet chemical development operation). In another embodiment, however, the resist 206 is removed in a same processing operation used to remove the overburden regions 212B of the dielectric material 212 (such as a wet chemical development operation). In an embodiment, the remaining cross-linked regions 214 are subjected to an additional curing process (e.g., additional heating following the cross-linking curing process). In one embodiment, the additional curing is performed following removal of the resist 206 and the overburden regions 212B.

Figure 2G:
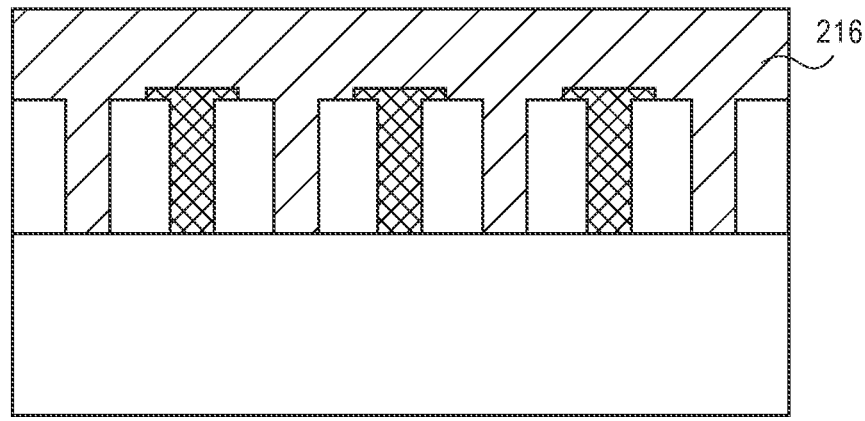

FIG. 2G illustrates a cross-sectional view of the structure of FIG. 2F following formation of a metal fill layer 216. The metal fill layer 216 may be formed in the open trenches (or holes) from FIG. 2F, and in overburden regions. The metal fill layer may be a single material layer, or may be formed from several layers, including conductive liner layers and fill layers. Any suitable deposition process, such as electroplating, chemical vapor deposition or physical vapor deposition, may be used to form metal fill layer 216. In an embodiment, the metal fill layer 216 is composed of a conductive material such as, but not limited to, Al, Ti, Zr, Hf, V, Ru, Co, Ni, Pd, Pt, Cu, W, Ag, Au or alloys thereof.

Figure 2H:
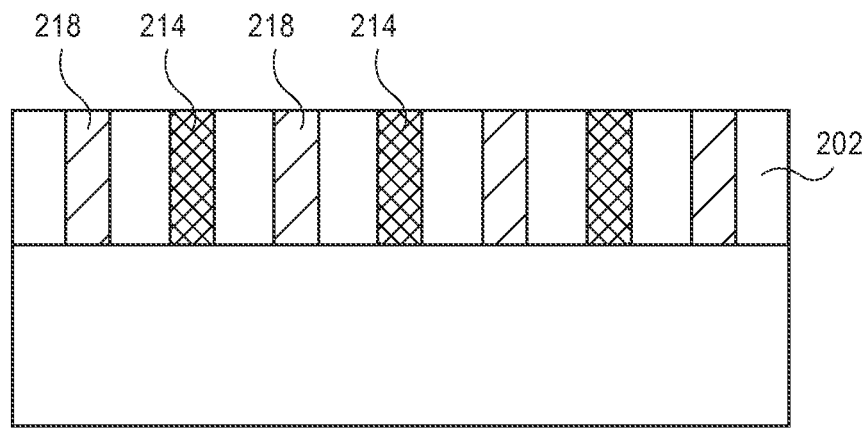

FIG. 2H illustrates a cross-sectional view of the structure of FIG. 2G following planarization of the metal fill layer to form metal features 218 (e.g., metal lines or vias). In an embodiment, the planarization of the metal fill layer 216 to form metal features 218 is performed using a chemical mechanical polishing process. An exemplary resulting structure is shown in FIG. 2H, where metal features 218 alternate with cross-linked (dielectric) regions 214 in an ILD material 202.

It is to be appreciated that the resulting structure of FIG. 2H may subsequently be used as a foundation for forming subsequent metal line/via and ILD layers. Alternatively, the structure of FIG. 2H may represent the final metal interconnect layer in an integrated circuit. Furthermore, it is to be appreciated that the above examples do not include etch-stop or metal capping layers in the Figures that may otherwise be necessary for patterning. However, for clarity, such layers are not included in the Figures since they do not impact the overall bottom-up fill concept.

With reference again to FIGS. 2A-2H, such a patterning scheme may be implemented as an integrated patterning approach that involves creating regular structures covering all possible locations, followed by selective patterning of only the desired features. The cross-lined regions 214 represent a material that can remain in a final structure as an ILD between the ends of the metal lines (e.g., as plugs), as described in greater detail in the exemplary embodiments provided below.

To provide context for the exemplary implementations of a tone reversal process flow, conductive vias and non-conductive spaces or interruptions between metals (referred to as "plugs") may be fabricated according to approaches described herein. In an example, FIGS. 6A-6I illustrate portions of integrated circuit layers representing various operations in a method of subtractive self-aligned via and plug patterning, in accordance with another embodiment of the present invention. In each illustration at each described operation, an angled three-dimensional cross-section view is provided.

Figure 6A:
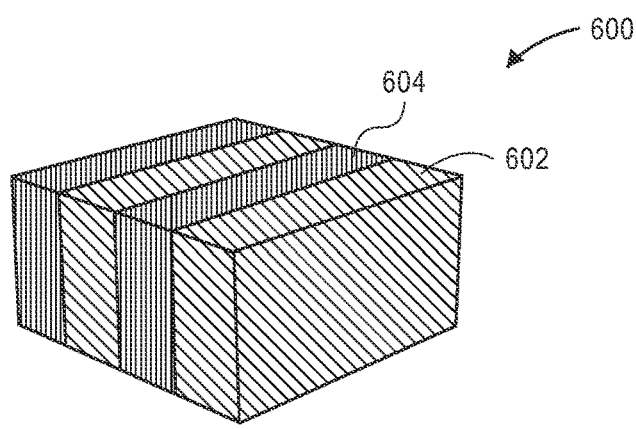
FIGS. 6A-6I illustrate portions of integrated circuit layers representing various operations in a method of subtractive self-aligned via and plug patterning, in accordance with another embodiment of the present invention, where.

FIG. 6A illustrates a starting point structure 600 for a subtractive via and plug process following deep metal line fabrication, in accordance with an embodiment of the present invention. Referring to FIG. 6A, structure 600 includes metal lines 602 with intervening interlayer dielectric (ILD) lines 604. It is to be appreciated that some of the lines 602 may be associated with underlying vias for coupling to a previous interconnect layer. In an embodiment, the metal lines 602 are formed by patterning trenches into an ILD material (e.g., the ILD material of lines 604). The trenches are then filled by metal and, if needed, planarized to the top of the ILD lines 604. In an embodiment, the metal trench and fill process involves high aspect ratio features. For example, in one embodiment, the aspect ratio of metal line height to metal line width is approximately in the range of 5-10.

Figure 6B:
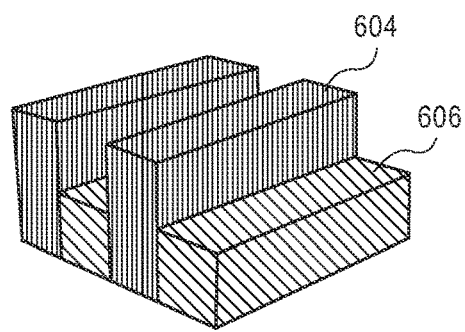

FIG. 6B illustrates the structure of FIG. 6A following recessing of the metal lines, in accordance with an embodiment of the present invention. Referring to FIG. 6B, the metal lines 602 are recessed selectively to provide first level metal lines 606. The recessing is performed selectively to the ILD lines 604. The recessing may be performed by etching through dry etch, wet etch, or a combination thereof. The extent of recessing may be determined by the targeted thickness of the first level metal lines 606 for use as suitable conductive interconnect lines within a back end of line (BEOL) interconnect structure.

Figure 6C:
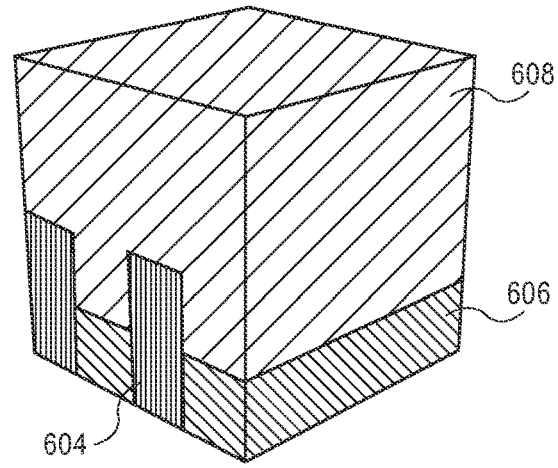

FIG. 6C illustrates the structure of FIG. 6B following formation of an interlayer dielectric (ILD) layer, in accordance with an embodiment of the present invention. Referring to FIG. 6C, an ILD material layer 608 is deposited and, if necessary, planarized, to a level above the recessed metal lines 606 and the ILD lines 604.

Figure 6D:
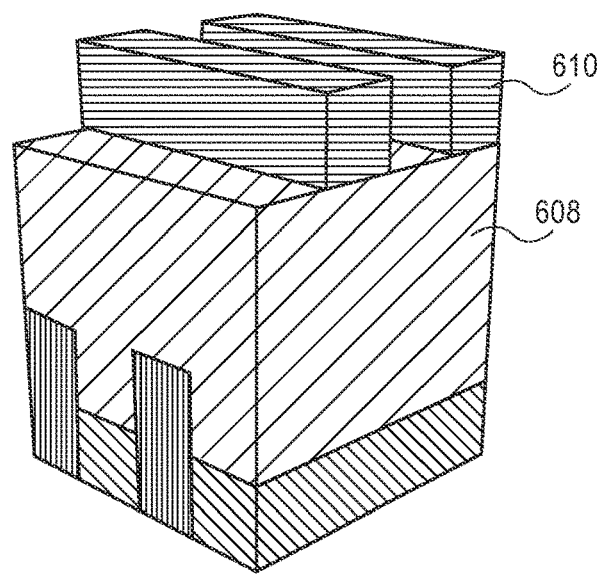

FIG. 6D illustrates the structure of FIG. 6C following deposition and patterning of a hardmask layer, in accordance with an embodiment of the present invention. Referring to FIG. 6D a hardmask layer 610 is formed on the ILD layer 608. In one such embodiment, the hardmask layer 610 is formed with a grating pattern orthogonal to the grating pattern of the first level metal lines 606/ILD lines 604, as is depicted in FIG. 6D. In an embodiment, the grating structure formed by the hardmask layer 610 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 610 of FIG. 6D may have hardmask lines spaced at a constant pitch and having a constant width.

Figure 6E:
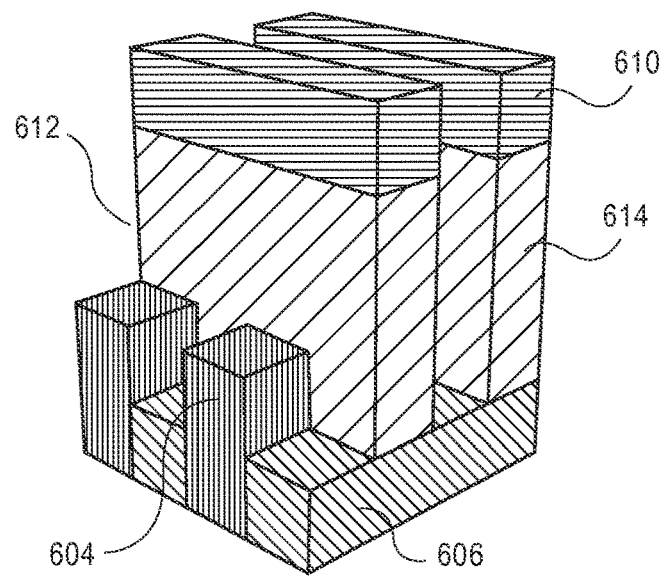

FIG. 6E illustrates the structure of FIG. 6D following trench formation defined using the pattern of the hardmask of FIG. 6D, in accordance with an embodiment of the present invention. Referring to FIG. 6E, the exposed regions (i.e., unprotected by 610) of the ILD layer 608 are etched to form trenches 612 and patterned ILD layer 614. The etch stops on, and thus exposes, the top surfaces of the first level metal lines 606 and the ILD lines 604.

Figure 6F:
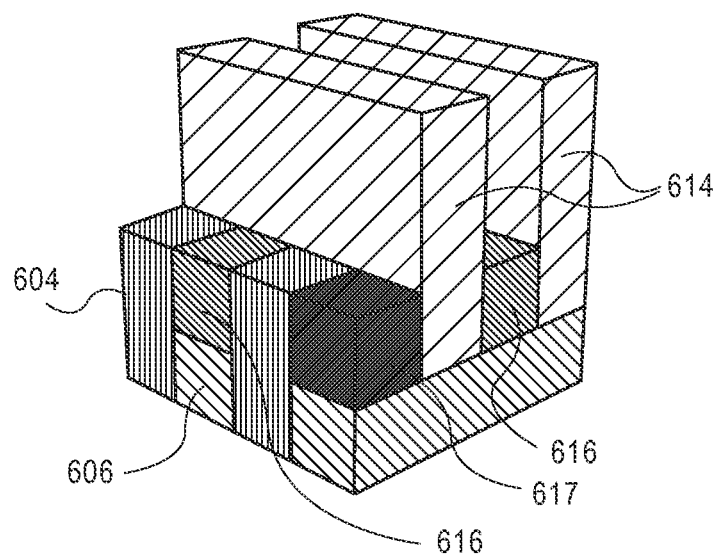

FIG. 6F illustrates the structure of FIG. 6E following resist and dielectric formation, in accordance with an embodiment of the present invention. Referring to FIG. 6F, chemically amplified photoresist 616 (such as chemically amplified photoresist 206) and dielectric material 617 (such as dielectric material 212 formed on the pre-catalyst layer 210) are formed in possible via locations above exposed portions of the recessed metal lines 606. Additionally, referring again to FIG. 6F, the hardmask layer 610 may be removed from the patterned ILD layer 614.

Figure 6G:
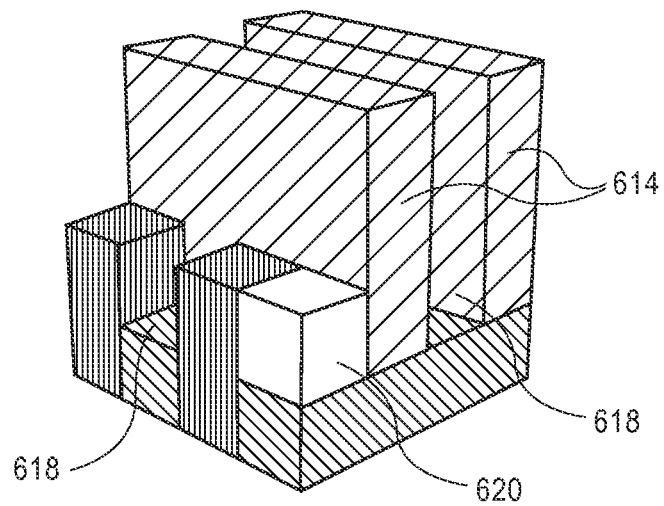

FIG. 6G illustrates the structure of FIG. 6F following cross-linking of the dielectric material 617 to form cross-linked portion 620. The chemically amplified photoresist 616 from FIG. 6F is then removed.

Figure 6H:
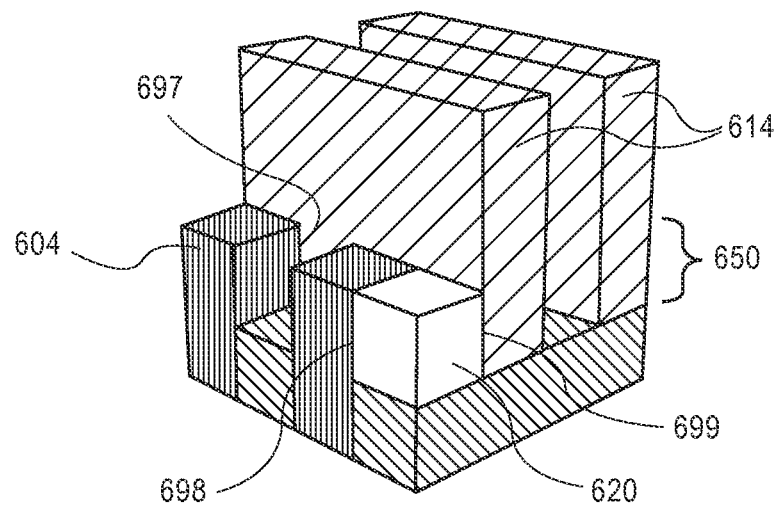

FIG. 6H illustrates the structure of FIG. 6G following further cross-linking of the cross-linked portion 620, e.g., to form a tone-reversed ILD, in accordance with an embodiment of the present invention. Referring to FIG. 6H, the final, cross-linked material has inter dielectric properties and, thus, can be retained in a final metallization structure, as described in association with FIGS. 2A-2H.

Referring again to FIG. 6H, in an embodiment, the resulting structure includes up to three different dielectric material regions (ILD lines 604+ILD lines 614+tone-reversed ILD 620) in a single plane 650 of the metallization structure. In one such embodiment, two or all of ILD lines 604, ILD lines 614, and tone-reversed ILD 620 are composed of a same material. In another such embodiment, ILD lines 604, ILD lines 614, and tone-reversed ILD 620 are all composed of different ILD materials. In either case, in a specific embodiment, a distinction such as a vertical seam between the materials of ILD lines 604 and ILD lines 614 (e.g., seam 697) and/or between ILD lines 604 and tone-reversed ILD 620 (e.g., seam 698) and/or between ILD lines 614 and tone-reversed ILD 620 (e.g., seam 699) may be observed in the final structure.

Figure 6I:
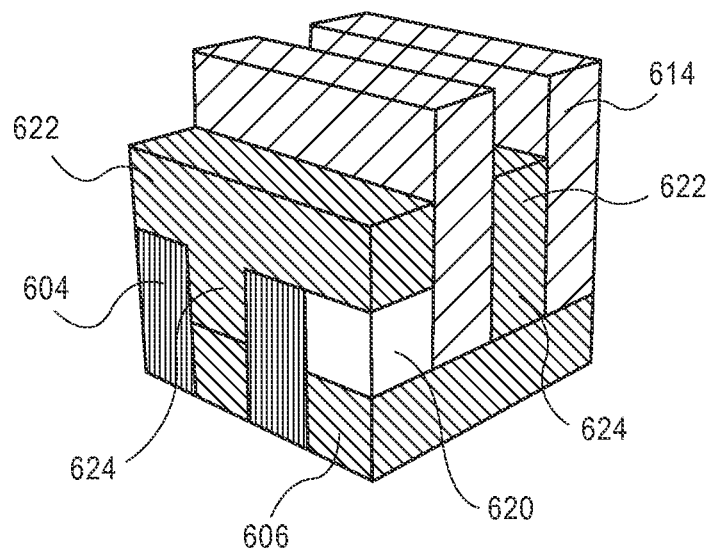

FIG. 6I illustrates the structure of FIG. 6H following metal line and via formation, in accordance with an embodiment of the present invention. Referring to FIG. 6I, metal lines 622 and vias 624 are formed upon metal fill of the openings of FIG. 6H. The metal lines 622 are coupled to the underlying metal lines 606 by the vias 624. In an embodiment, the openings are filled in a damascene approach or a bottom-up fill approach to provide the structure shown in FIG. 6I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 614 may be removed to provide air gaps between the resulting metal lines 624.

The structure of FIG. 6I may subsequently be used as a foundation for forming subsequent metal line/via and ILD layers. Alternatively, the structure of FIG. 6I may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithography/dual damascene patterning that must otherwise be tolerated, is not a factor for the resulting structures described herein. Referring again to FIG. 6I, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In an embodiment, with reference again to FIGS. 6A-6I, the term "grating structure" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, with reference again to FIGS. 6A-6I, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, with reference again to FIGS. 6A-6I, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, with reference again to FIGS. 6A-6I, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

With reference again to FIGS. 6A-6I, it is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Overall, in accordance with one or more embodiments of the present invention, approaches described herein involve use of tone-reversed interlayer dielectric (ILD) to select locations for plugs. The tone-reversed ILD composition is typically very different from standard ILD.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
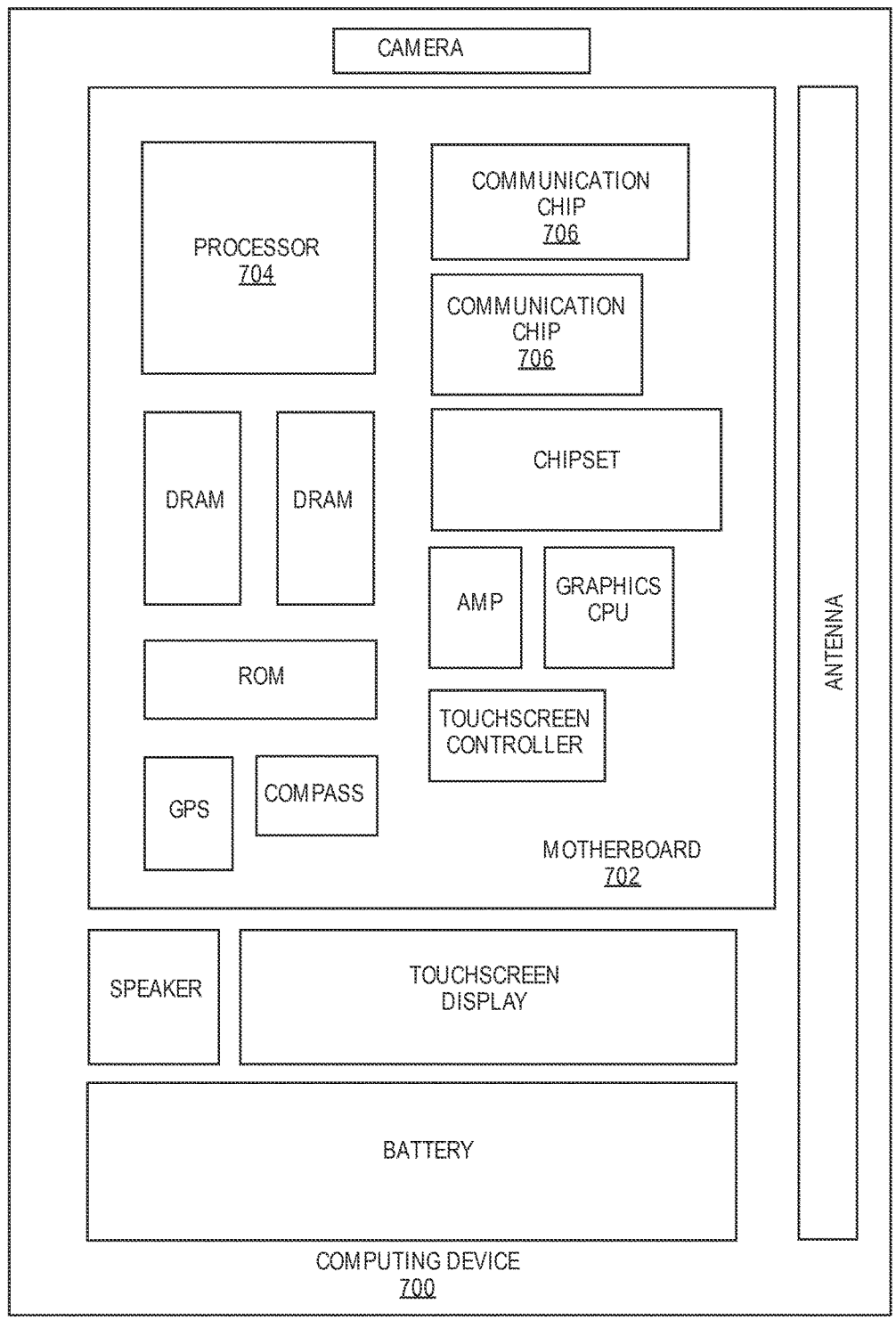
FIG. 7 illustrates a computing device in accordance with one implementation of an embodiment of the invention.

FIG. 7 illustrates a computing device 700 in accordance with one implementation of an embodiment of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of an embodiment of the invention, the integrated circuit die of the processor includes one or more structures, such as plugs for back end of line (BEOL) interconnects formed from image tone-reversal with a dielectric using bottom-up cross-linking, built in accordance with implementations of an embodiment of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of an embodiment of the invention, the integrated circuit die of the communication chip includes one or more structures, such as plugs for back end of line (BEOL) interconnects formed from image tone-reversal with a dielectric using bottom-up cross-linking, built in accordance with implementations of an embodiment of the invention.

In further implementations, another component housed within the computing device 700 may contain an integrated circuit die that includes one or more structures, such as plugs for back end of line (BEOL) interconnects formed from image tone-reversal with a dielectric using bottom-up cross-linking, built in accordance with implementations of an embodiment of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
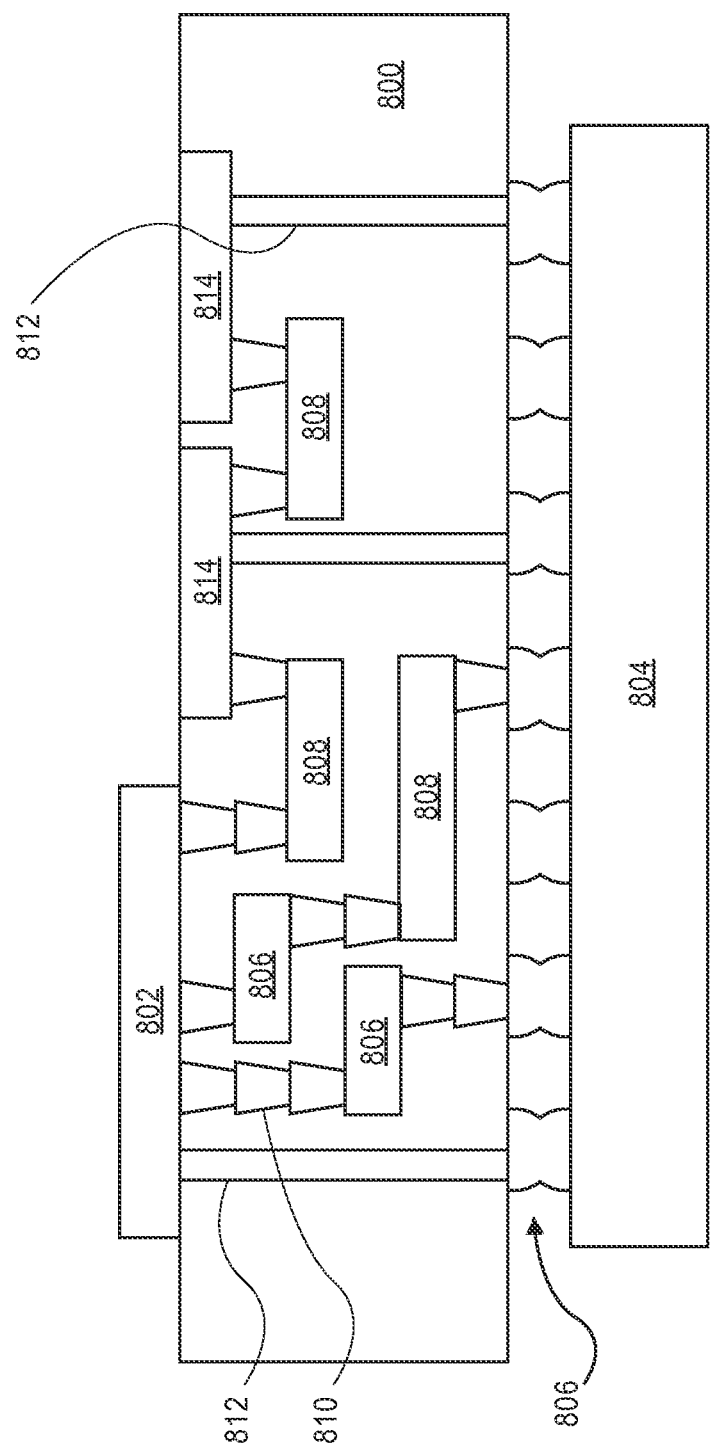
FIG. 8 is an interposer implementing one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Thus, embodiments of the present invention include image tone-reversal with a dielectric using bottom-up cross-linking for back end of line (BEOL) interconnects.

In an embodiment, a semiconductor structure including a metallization layer includes a plurality of trenches in an interlayer dielectric (ILD) layer above a substrate. A pre-catalyst layer is on sidewalls of one or more, but not all, of the plurality of trenches. Cross-linked portions of a dielectric material are proximate the pre-catalyst layer, in the one or more of the plurality of trenches. Conductive structures are in remaining ones of the trenches.

In one embodiment, the plurality of trenches exposes a plurality of underlying metal lines of the semiconductor structure.

In one embodiment, the pre-catalyst layer is not on the exposed plurality of underlying metal lines of the semiconductor structure.

In one embodiment, the plurality of trenches includes a grating-like pattern.

In one embodiment, the cross-linked portions of the dielectric material include cross-linked trisilacyclohexanes linked together by O groups.

In one embodiment, a method of performing tone reversal with a dielectric using bottom-up cross-linking includes forming a plurality of trenches in an interlayer dielectric (ILD) layer formed above a substrate. The method also includes forming a pre-catalyst layer on exposed portions of the ILD layer, including on sidewalls of one or more, but not all, of the plurality of trenches. The method also includes forming a dielectric material on the pre-catalyst layer. The method also includes cross-linking portions of the dielectric material proximate the pre-catalyst layer. The method also includes forming conductive structures in remaining ones of the plurality of trenches.

In one embodiment, the plurality of trenches exposes a plurality of underlying metal lines in a metallization layer above the substrate.

In one embodiment, the pre-catalyst layer is not formed on the exposed plurality of underlying metal lines.

In one embodiment, forming the plurality of trenches includes forming a grating-like pattern using a patterning scheme based on pitch halving or pitch quartering.

In one embodiment, forming the pre-catalyst layer includes forming a layer of catalyst or pre-catalyst by direct adsorption.

In one embodiment, forming the pre-catalyst layer includes forming a layer of catalyst or pre-catalyst by covalent adhesion.

In one embodiment, forming the dielectric material includes forming the dielectric material by a spin-on process.

In an embodiment, a method of fabricating a metallization layer for a semiconductor structure includes forming a plurality of trenches in an interlayer dielectric (ILD) layer formed above a substrate. The method also includes forming a chemically amplified photoresist in the plurality of trenches. The method also includes removing the chemically amplified photoresist from one or more, but not all, of the plurality of trenches using positive tone processing. The method also includes forming a pre-catalyst layer on exposed portions of the ILD layer, including on sidewalls of the one or more of the plurality of trenches, but not on remaining portions of the chemically amplified photoresist. The method also includes forming a dielectric material above the ILD layer, on the pre-catalyst layer, in the one or more of the plurality of trenches, and above the remaining portions of the chemically amplified photoresist. The method also includes cross-linking portions of the dielectric material proximate the pre-catalyst layer, in the one or more of the plurality of trenches, but not portions of the dielectric layer above the remaining portions of the chemically amplified photoresist. The method also includes removing portions of the dielectric layer that were not cross-linked. The method also includes removing the remaining portions of the chemically amplified photoresist. The method also includes forming conductive structures in trenches formed on the ILD layer formed upon removal of the chemically amplified photoresist.

In one embodiment, removing the chemically amplified photoresist from one or more of the plurality of trenches exposes a plurality of underlying metal lines of the semiconductor structure.

In one embodiment, the pre-catalyst layer is not formed on the exposed plurality of underlying metal lines of the semiconductor structure.

In one embodiment, forming the plurality of trenches includes forming a grating-like pattern using a patterning scheme based on pitch halving or pitch quartering.

In one embodiment, forming the pre-catalyst layer includes forming a layer of catalyst or pre-catalyst by direct adsorption.

In one embodiment, forming the pre-catalyst layer includes forming a layer of catalyst or pre-catalyst by covalent adhesion.

In one embodiment, forming the dielectric material includes forming the dielectric material by a spin-on process.

In one embodiment, cross-linking the portions of the dielectric material includes thermally curing the portions of the dielectric material.

In one embodiment, the portions of the dielectric layer that were not cross-linked and the remaining portions of the chemically amplified photoresist are removed in a same process operation.

In one embodiment, the remaining portions of the chemically amplified photoresist are removed in a different, subsequent, process operation than a process operation used to remove the portions of the dielectric layer that were not cross-linked.

In one embodiment, the method further includes, subsequent to removing the remaining portions of the chemically amplified photoresist and the portions of the dielectric layer that were not cross-linked, performing additional curing of the cross-linked portions of the dielectric material.

In one embodiment, forming the conductive structures includes forming an excess of a metal fill material and subsequently planarizing the metal fill material.

In one embodiment, cross-linking portions of the dielectric material includes forming cross-linked trisilacyclohexanes linked together by O groups.

What is claimed is:

1. A semiconductor structure comprising a metallization layer, the metallization layer comprising:
   a plurality of trenches in an interlayer dielectric (ILD) layer above a substrate;
   a pre-catalyst layer on sidewalls of one or more, but not all, of the plurality of trenches;
   cross-linked portions of a dielectric material proximate the pre-catalyst layer, in the one or more of the plurality of trenches; and
   conductive structures in remaining ones of the trenches.

2. The semiconductor structure of claim 1, wherein the plurality of trenches exposes a plurality of underlying metal lines of the semiconductor structure.

3. The semiconductor structure of claim 2, wherein the pre-catalyst layer is not on the exposed plurality of underlying metal lines of the semiconductor structure.

4. The semiconductor structure of claim 1, wherein the plurality of trenches comprises a grating-like pattern.

5. The semiconductor structure of claim 1, wherein the cross-linked portions of the dielectric material comprise cross-linked trisilacyclohexanes linked together by O groups.

* * * * *